United States Patent [19]
Yanagawa et al.

[11] Patent Number: 5,929,694
[45] Date of Patent: Jul. 27, 1999

[54] SEMICONDUCTOR DEVICE HAVING VOLTAGE GENERATION CIRCUIT

[75] Inventors: Miki Yanagawa; Yasurou Matsuzaki, both of Kawasaki, Japan

[73] Assignee: Fujitsu Limited, Kanagawa, Japan

[21] Appl. No.: 08/933,034

[22] Filed: Sep. 18, 1997

[30] Foreign Application Priority Data

Apr. 10, 1997 [JP] Japan ..................................... 9-092022

[51] Int. Cl.⁶ ....................................................... G05F 1/10
[52] U.S. Cl. .............................. 327/536; 327/540; 326/87
[58] Field of Search ..................................... 327/536, 537, 327/534, 538, 540; 363/60; 326/87

[56] References Cited

U.S. PATENT DOCUMENTS

| | | | |
|---|---|---|---|
| 5,337,284 | 8/1994 | Cordoba et al. | 365/227 |
| 5,434,820 | 7/1995 | Kim | 365/189.09 |
| 5,708,387 | 1/1998 | Cleveland et al. | 327/536 |
| 5,732,039 | 3/1998 | Javanifard et al. | 365/226 |

*Primary Examiner*—Kenneth B. Wells
*Assistant Examiner*—Hai L. Nguyen
*Attorney, Agent, or Firm*—Nikaido, Marmelstein, Murray & Oram, LLP

[57] ABSTRACT

A semiconductor device operates in one of at least two different modes including a first mode and a second mode. The semiconductor device includes a first voltage generating circuit operating in the first mode and the second mode and having a power to supply a first amount of current in order to generate a predetermined voltage level, and a second voltage generating circuit operating only in the second mode and having a power to supply a second amount of current greater than the first amount of current in order to generate the predetermined voltage level, wherein the first voltage generating circuit increases the first amount of current in the second mode compared to in the first mode.

14 Claims, 8 Drawing Sheets

5,929,694

SEMICONDUCTOR DEVICE HAVING VOLTAGE GENERATION CIRCUIT

BACKGROUND OF THE INVENTION

1. Field of the Invention

The present invention generally relates to semiconductor devices, and particularly relates to a voltage pumping-up circuit and a substrate-voltage generating circuit used in semiconductor devices.

2. Description of the Related Art

Semiconductor devices generally need to generate internal voltages which are different from a power voltage VDD and a ground voltage VSS when the power voltage VDD and a ground voltage VSS are externally provided.

In semiconductor memory devices such as DRAMs, for example, the voltage VDD (HIGH) is stored in capacitors serving as memory cells. In this case, cell transistors connected to the memory cells are turned on in order to provide electric charge from bit lines to the memory cells via the cell transistors. In order to achieve high-speed electric charge of the memory cells, gates of the cell transistors need to receive a voltage level VDD+Vth+α. Here, the voltage level Vth is a threshold voltage level of the cell transistors. As can be understood, a voltage level higher than the voltage VDD by a margin of the threshold voltage level is necessary as the gate voltage in order to charge the memory cells to the voltage level VDD. The voltage level α is an overdrive voltage for the purpose of charging the memory cells at high speed. Namely, a voltage level having a margin of this overdrive voltage level achieves high-speed electric charge when it is applied to the gates of the cell transistors.

In order to generate an internal voltage higher than an externally provided power voltage, a voltage pumping-up circuit is used in semiconductor devices. FIG. 1 is a circuit diagram of an example of a voltage pumping-up circuit used in the related art.

The voltage pumping-up circuit of FIG. 1 includes a first voltage pumping-up circuit 210, a second voltage pumping-up circuit 220, a pumped-up-voltage sensor 230, and an oscillator 231. The first voltage pumping-up circuit 210 includes NMOS transistors 211 and 212, inverters 213 and 214, and a capacitor 215. The second voltage pumping-up circuit 220 includes NMOS transistors 221 and 222, a NAND circuit 223, an inverter 224, and a capacitor 225. Here, the capacitors 215 and 225 are generally embodied by using a gap between the gate and the source/drain of a transistor as a capacitor, and this capacitor has the gate of the transistor as one end and the connected source and drain as the other end.

The first voltage pumping-up circuit 210 operates at all the time, and is used when the semiconductor device is in either one of a standby mode and an active mode. The second voltage pumping-up circuit 220 only operates when the semiconductor device is in the active mode. Switching the second voltage pumping-up circuit 220 depending on the operation mode is controlled by an active signal which is supplied to the NAND circuit 223 of the second voltage pumping-up circuit 220. The active signal becomes HIGH when the active mode is used. The standby mode refers to an operation mode in which the semiconductor device is waiting for a next operation. In the case of semiconductor memory devices such as DRAMs, for example, the standby mode means that a semiconductor device is waiting for next access such as data-read access or data-write access. The active mode means that a semiconductor device is in operation. A semiconductor memory device such as a DRAM in the active mode is responding to access such as data-read access or data-write access.

Operations of the first voltage pumping-up circuit 210 and the second voltage pumping-up circuit 220 are basically the same. A description of operations will be provided below by taking the first voltage pumping-up circuit 210 as an example.

The first voltage pumping-up circuit 210 generates a pumped-up voltage VDH at an output node OUT. When a current is drawn from the output node OUT and consumed in the semiconductor device, the pumped-up voltage VDH is lowered. The pumped-up-voltage sensor 230 monitors the pumped-up voltage VDH, and activates the oscillator 231 when the pumped-up voltage VDH becomes lower than a predetermined threshold voltage. When the oscillator 231 operates, the first voltage pumping-up circuit 210 raises the pumped-up voltage VDH higher than the predetermined threshold voltage.

In detail, when the oscillator 231 has a LOW-level output, the output of the inverter 214 is LOW. A current flows through the NMOS transistor 211 serving as a diode, so that a voltage level at a node A becomes VDD-Vth which is lower than the power voltage VDD by a margin of the threshold voltage level Vth of the NMOS transistor 211. Then, the output of the oscillator 231 is turned into HIGH. In response, the output of the inverter 214 becomes HIGH (voltage VDD). Since the output of the inverter 214 is connected to the node A via the capacitor, the voltage at the node A becomes 2VDD-Vth. At this time, the pumped-up voltage VDH is lower than the voltage at the node A, so that the NMOS transistor 212 is turned on. Charge stored in the capacitor 215 is provided from the node A to the output node OUT, thereby boosting the pumped-up voltage VDH.

As the oscillator 231 switches its output back and forth between HIGH and LOW, the operation described above is repeated again and again, thereby boosting the pumped-up voltage VDH above the predetermined voltage level. When the pumped-up voltage VDH reaches a point higher than the predetermined voltage level, the operation of the oscillator 231 which is controlled by the pumped-up-voltage sensor 230 stops.

In the standby mode, only the first voltage pumping-up circuit 210 operates. Since electric-power consumption is small inside the semiconductor device in the standby mode, the pumped-up voltage VDH shows only a small and gradual change. Because of this, small current-supply power is sufficient for the first voltage pumping-up circuit 210. It is desirable, also, to keep power consumption in the first voltage pumping-up circuit 210 as small as possible. Therefore, the capacitor 215 of the first voltage pumping-up circuit 210 has a relatively small capacitance, and the inverter 214 for driving the capacitor 215 has a relatively small driving power.

The second voltage pumping-up circuit 220 is provided for use in the active mode. Since electric-power consumption is large inside the semiconductor device in the active mode, the pumped-up voltage VDH shows large and rapid changes. Because of this, great current-supply power is necessary for the second voltage pumping-up circuit 220. The capacitor 225 of the second voltage pumping-up circuit 220 needs to have a relatively large capacitance, and the inverter 224 for driving the capacitor 225 needs to have a relatively great driving power. The first voltage pumping-up circuit 210 is also used in the active mode. This is just reflection of a consideration to make the best possible use of the first voltage pumping-up circuit 210 in order to enhance current-supply power in the active mode as much as possible.

The capacitor 215 of the first voltage pumping-up circuit 210 and the capacitor 225 of the second voltage pumping-up circuit 220 have an area ratio of 1:2 to 1:4. A total area size of the capacitors reaches as large as several thousand micro-square meters. The areas of the capacitors 215 and 225, especially, the size of the capacitor 225, occupy a large percentage of a total chip area. The size of the capacitor 225 is one of the main reasons for an increase in the chip size.

The same problems are observed in substrate-voltage generating circuits which generate a voltage level lower than the ground voltage by using a similar circuit configuration as that of the voltage pumping-up circuit.

Accordingly, there is a need for a semiconductor device which can make better use of chip areas by shrinking sizes of capacitors used in voltage pumping-up circuits and substrate-voltage generating circuits.

SUMMARY OF THE INVENTION

Accordingly, it is a general object of the present invention to provide a semiconductor device which can satisfy the need described above.

It is another and more specific object of the present invention to provide a semiconductor device which can make better use of chip areas by shrinking sizes of capacitors used in voltage pumping-up circuits and substrate-voltage generating circuits.

In order to achieve the above objects according to the present invention, a semiconductor device operates in one of at least two different modes including a first mode and a second mode includes a first voltage generating circuit operating in the first mode and the second mode and having a power to supply a first amount of current in order to generate a predetermined voltage level, and a second voltage generating circuit operating only in the second mode and having a power to supply a second amount of current greater than the first amount of current in order to generate the predetermined voltage level, wherein the first voltage generating circuit increases the first amount of current in the second mode compared to in the first mode.

In the semiconductor device described above, the first voltage generating circuit operates in the first mode and the second mode, and increases output-current driving power in the second mode compared to in the first mode, thereby reducing the load on the second voltage generating circuit operating in the second mode. Therefore, an area size of capacitors used in the second voltage generating circuit can be reduced.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
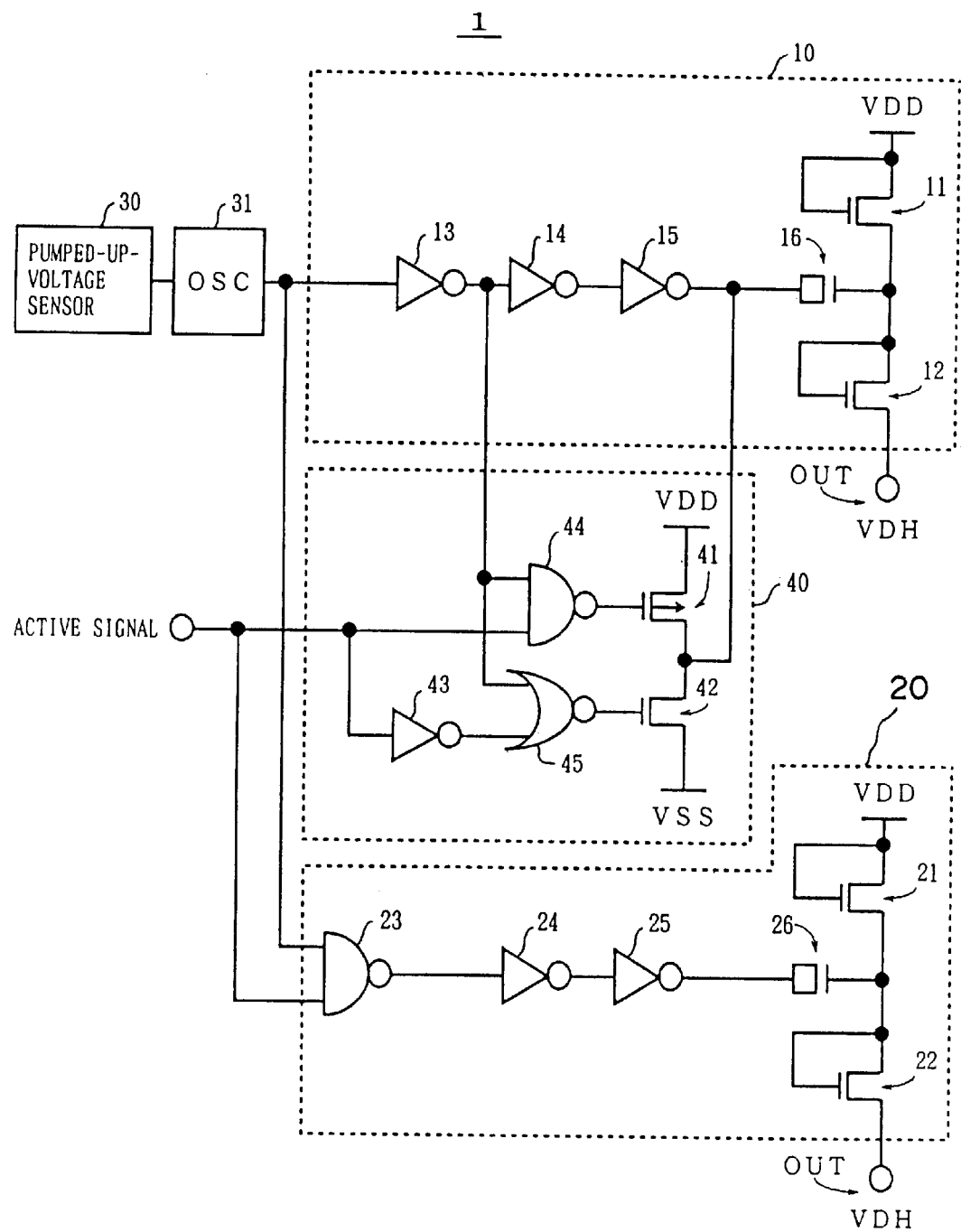
FIG. 2 is a circuit diagram of a first embodiment of a voltage pumping-up circuit according to the present invention.

FIG. 2 is a circuit diagram of a first embodiment of a voltage pumping-up circuit according to the present invention.

A voltage pumping-up circuit 1 of FIG. 2 includes a first voltage pumping-up circuit 10, a second voltage pumping-up circuit 20, a pumped-up-voltage sensor 30, an oscillator 31, and a driving-power-control circuit 40. The first voltage pumping-up circuit 10 includes NMOS transistors 11 and 12, inverters 13 through 15, and a capacitor 16. The second voltage pumping-up circuit 20 includes NMOS transistors 21 and 22, a NAND circuit 23, inverters 24 and 25, and a capacitor 26. The driving-power-control circuit 40 includes a PMOS transistor 41, a NMOS transistor 42, an inverter 43, a NAND circuit 44, and a NOR circuit 45. For the sake of explanation, the driving-power-control circuit 40 is treated as a separate circuit from the first voltage pumping-up circuit 10. It is apparent, however, that the driving-power-control circuit 40 can be regarded as part of the first voltage pumping-up circuit 10.

The first voltage pumping-up circuit 10 operates at all the time, and is used when the semiconductor device is in either one of a standby mode and an active mode. The second voltage pumping-up circuit 20 only operates when the semiconductor device is in the active mode. The driving-power-control circuit 40 operates only in the active mode, and steps up current-supply power of the first voltage pumping-up circuit 10. Switching of the second voltage pumping-up circuit 20 and the driving-power-control circuit 40 between the two modes is controlled by an active signal which is supplied to the second voltage pumping-up circuit 20 and the driving-power-control circuit 40. The active signal becomes HIGH when the active mode is used.

Figure 1:
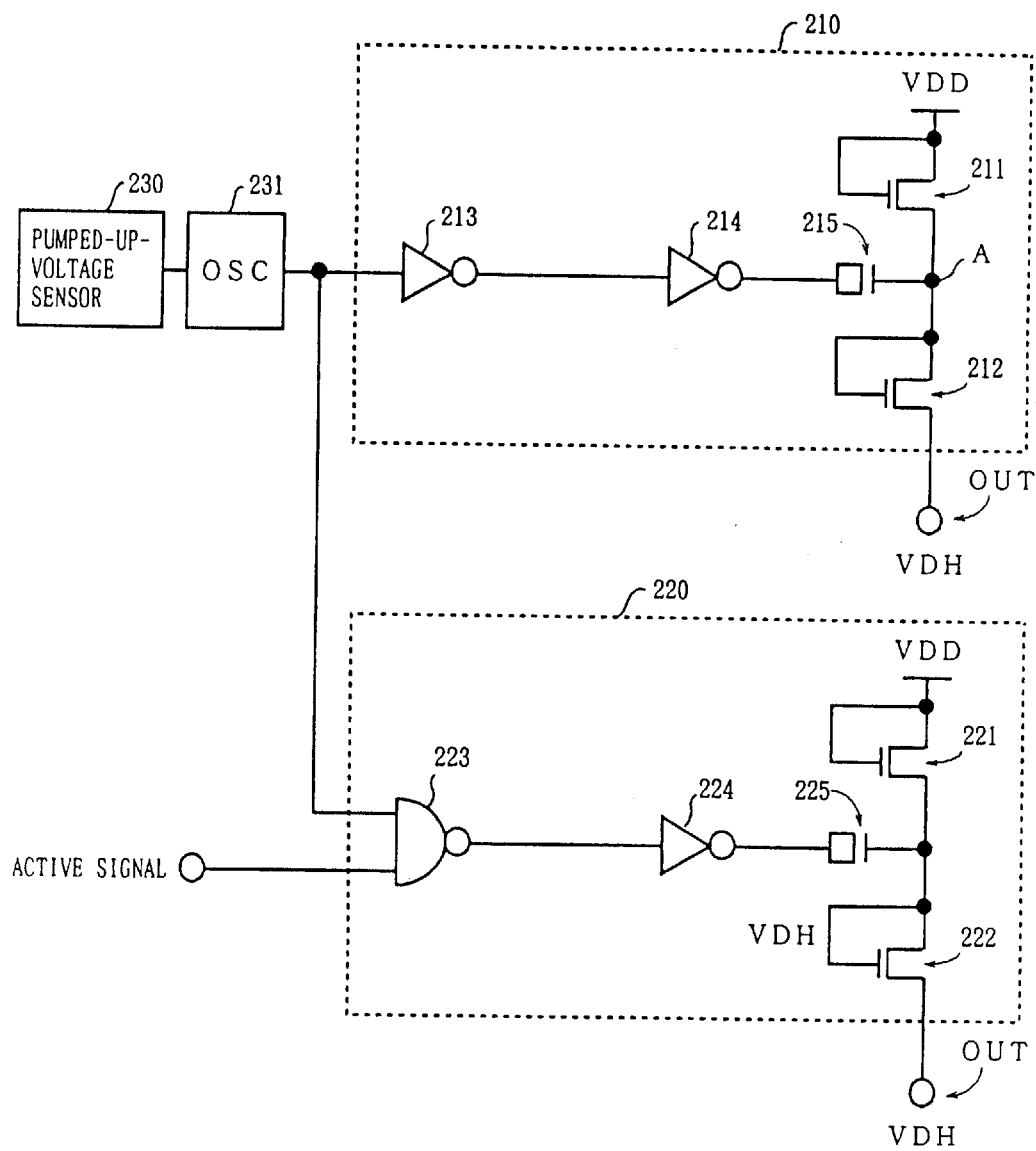
FIG. 1 is a circuit diagram of an example of a voltage pumping-up circuit used in the related art.

Operations of the first voltage pumping-up circuit 10 and the second voltage pumping-up circuit 20 are basically the same as the operation of the voltage pumping-up circuit of FIG. 1. Namely, the first voltage pumping-up circuit 10 generates a pumped-up voltage VDH at an output node OUT. When a current is drawn from the output node OUT and consumed in the semiconductor device, the pumped-up voltage VDH is lowered. The pumped-up-voltage sensor 30 monitors the pumped-up voltage VDH, and activates the oscillator 31 when the pumped-up voltage VDH becomes lower than a predetermined threshold voltage. When the oscillator 31 operates, the first voltage pumping-up circuit 10 raises the pumped-up voltage VDH higher than the predetermined threshold voltage.

In detail, when the oscillator 31 has a HIGH-level output, the output of the inverter 15 is LOW. A current flows through the NMOS transistor 11 serving as a diode, so that a voltage level at a node A becomes VDD-Vth which is lower than the power voltage VDD by a margin of the threshold voltage level Vth of the NMOS transistor 11. Then, the output of the oscillator 31 is turned into LOW. In response, the output of the inverter 15 becomes HIGH (voltage VDD). Since the output of the inverter 15 is connected to the node A via the capacitor, the voltage at the node A becomes 2VDD-Vth. At this time, the pumped-up voltage VDH is lower than the voltage at the node A, so that the NMOS transistor 12 is turned on. Charge stored in the capacitor 16 is provided from the node A to the output node OUT, thereby boosting the pumped-up voltage VDH.

As the oscillator 31 switches its output back and forth between HIGH and LOW, the operation described above is repeated again and again, thereby boosting the pumped-up voltage VDH above the predetermined voltage level. When the pumped-up voltage VDH reaches a point higher than the predetermined voltage level, the operation of the oscillator 31 which is controlled by the pumped-up-voltage sensor 30 stops.

Operations of the second voltage pumping-up circuit 20 is the same as those of the first voltage pumping-up circuit 10, except for that the NAND circuit 23 serves as an inverter for inverting the output of the oscillator 31 when the active signal is HIGH, and serves to stop operations of the second voltage pumping-up circuit 20 when the active signal is LOW. As can be seen, an additional inverter is provided in the first voltage pumping-up circuit 10 and the second voltage pumping-up circuit 20 in comparison with the voltage pumping-up circuit of FIG. 1. This inverter is provided for the sake of aligning the amount of gate delay with that of the driving-power-control circuit 40, and is not an essential element vital to the operations.

In the first voltage pumping-up circuit 10, the inverter 15 for driving the capacitor 16 has a relatively small driving power since it is necessary only to satisfy a required amount of current supply in the standby mode.

The first voltage pumping-up circuit 10 operates also in the active mode. When operating in the active mode, the current-supply power of the first voltage pumping-up circuit 10 is stepped up by the driving-power-control circuit 40.

In the active mode, the NAND circuit 44 and the NOR circuit 45 of the driving-power-control circuit 40 serve as inverters. In this case, the output of the inverter 13 in the first voltage pumping-up circuit 10 is inverted by the NAND circuit 44 and the NOR circuit 45 to be supplied to the gates of the PMOS transistor 41 and the NMOS transistor 42, respectively. Since the PMOS transistor 41 and the NMOS transistor 42 together form an inverter for inverting a gate input, the output of the driving-power-control circuit 40 is in the same phase as that of the inverter 15 in the first voltage pumping-up circuit 10. The output of the driving-power-control circuit 40 is supplied to the capacitor 16 of the first voltage pumping-up circuit 10, and drives the capacitor 16.

In the active mode, therefore, the capacitor 16 of the first voltage pumping-up circuit 10 is driven by the inverter 15 of the first voltage pumping-up circuit 10 as well as by the PMOS transistor 41 which is an output transistor of the driving-power-control circuit 40. The PMOS transistor 41 and the NMOS transistor 42 have a relatively wide gate width and a relatively small internal resistance, and, thus, have a greater current driving power than the inverter 15.

In this manner, a large current is supplied to the capacitor 16 from the PMOS transistor 41 of the driving-power-control circuit 40 in addition to the current from an output transistor (not shown) of the inverter 15, so that the capacitor 16 is charged at a speed commensurate with the amount of supplied current. Charge stored in the capacitor 16 is then supplied to the output node OUT. The amount of charge supplied to the output node OUT is commensurate with a sum of the driving power of the inverter 15 and the great driving power of the PMOS transistor 41, so that the first voltage pumping-up circuit 10 exhibits a great current-supply power in the active mode.

In the standby mode, the NAND circuit 44 of the driving-power-control circuit 40 has an output fixed to a HIGH level, and the output of the NOR circuit 45 is fixed to a LOW level. In this case, both the PMOS transistor 41 and the NMOS transistor 42 are turned off, thereby leaving the output of the driving-power-control circuit 40 in a floating state (high-impedence state). The driving-power-control circuit 40 thus does not interfere with the operation of the first voltage pumping-up circuit 10 in the standby mode.

As described above, the voltage pumping-up circuit 1 of FIG. 2 in the standby mode allows only the first voltage pumping-up circuit 10 to operate and supply the pumped-up voltage VDH by the small current-supply power. In the active mode, the second voltage pumping-up circuit 20 is operated to supply the pumped-up voltage VDH by the great current-supply power, and, at the same time, the first voltage pumping-up circuit 10 having a driving power boosted by the driving-power-control circuit 40 supplies the pumped-up voltage VDH by the great current-supply power. Compared to the capacitor 225 of the second voltage pumping-up circuit 220 shown in FIG. 1, therefore, the capacitor 26 of the second voltage pumping-up circuit 20 can be made smaller in size, while a total current-supply power in the active mode is maintained to be compatible to that of the related-art voltage pumping-up circuit. That is, the size of the capacitor 26 in the second voltage pumping-up circuit 20 can be made smaller as the current-supply power of the first voltage pumping-up circuit 10 is stepped up.

Assuming that the driving power of the driving-power-control circuit 40 is about the same as that of the inverter 25 of the second voltage pumping-up circuit 20, the size of the capacitor 26 of the second voltage pumping-up circuit 20 can be reduced by the size of the capacitor 16 of the first voltage pumping-up circuit 10. In this case, an area ratio of the capacitor 16 to the capacitor 26 can be reduced to 1:2 from an area ratio of 1:3, for example, thereby reducing an area size occupied by the capacitors.

Figure 3:
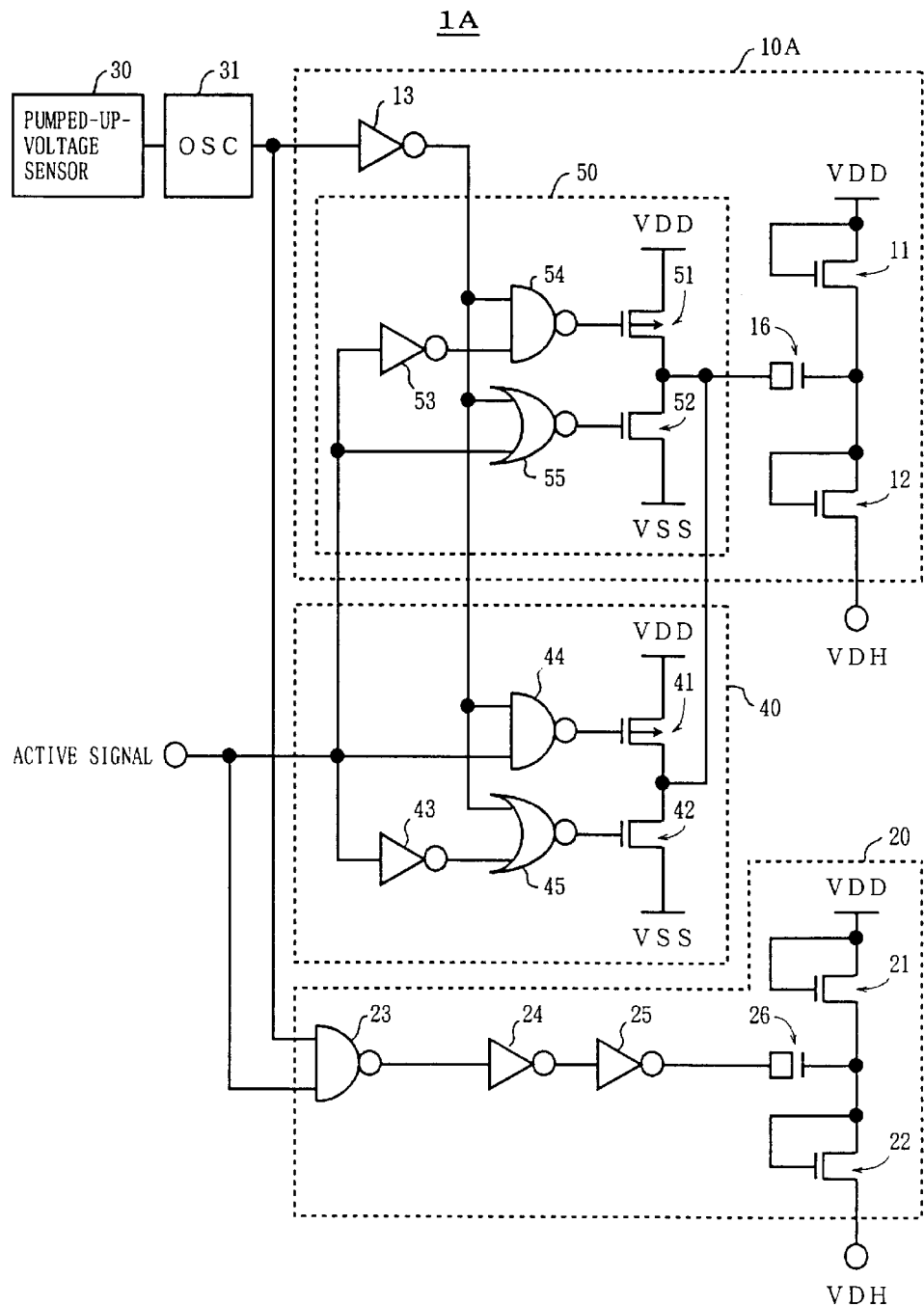
FIG. 3 is a circuit diagram of a second embodiment of a voltage pumping-up circuit according to the present invention.

FIG. 3 is a circuit diagram of a second embodiment of a voltage pumping-up circuit according to the present invention. In FIG. 3, the same elements as those of FIG. 2 are referred to by the same numerals, and a description thereof will be omitted.

A voltage pumping-up circuit 1A of FIG. 3 includes a first voltage pumping-up circuit 10A, the second voltage pumping-up circuit 20, the pumped-up-voltage sensor 30, the oscillator 31, and the driving-power-control circuit 40. Elements other than the first voltage pumping-up circuit 10A are the same as those of the voltage pumping-up circuit 1 shown in FIG. 2.

In FIG. 3, the first voltage pumping-up circuit 10A includes the NMOS transistors 11 and 12, the inverter 13, a control circuit 50, and the capacitor 16. Elements other than the control circuit 50 are the same as those of the first voltage pumping-up circuit 10 shown in FIG. 2.

The control circuit 50 includes a PMOS transistor 51, a NMOS transistor 52, an inverter 53, a NAND circuit 54, and a NOR circuit 55. In the control circuit 50, the NAND circuit 54 and the NOR circuit 55 serve as inverters in the standby mode. In this case, the output of the inverter 13 is inverted by the NAND circuit 54 and the NOR circuit 55, and, then, is supplied to the gate of the PMOS transistor 51 and to the gate of the NMOS transistor 52. The PMOS transistor 51 and the NMOS transistor 52 together form an inverter for inverting the gate input, so that a signal in the same phase as the output of the inverter 13 is supplied to the capacitor 16.

In the standby mode, therefore, the first voltage pumping-up circuit 10A operates in the same manner as the first voltage pumping-up circuit 10 of FIG. 2 in generating the pumped-up voltage VDH.

In the active mode, the output of the NAND circuit 54 in the control circuit 50 is fixed to a HIGH level, and the output of the NOR circuit 45 is fixed to a LOW level. In this case, the PMOS transistor 51 and the NMOS transistor 52 are turned off, so that the output of the control circuit 50 is maintained in a floating state (high-impedance state). In the active mode, therefore, only the driving-power-control circuit 40 drives the capacitor 16 of the first voltage pumping-up circuit 10A.

In this manner, the first voltage pumping-up circuit 10A of FIG. 3, unlike the first voltage pumping-up circuit 10 of FIG. 2, does not drive the capacitor 16 in the active mode. Only the driving-power-control circuit 40 drives the capacitor 16 of the first voltage pumping-up circuit 10A in the case of the active mode. In the configuration of FIG. 2, there is a possibility of the output of the inverter 15 of the first voltage pumping-up circuit 10 and the output of the driving-power-control circuit 40 conflicting with each other because of differences in signal timing or the like. In the configuration of FIG. 3, on the other hand, the control circuit 50 drives the capacitor 16 in the standby mode, while the driving-power-control circuit 40 drives the capacitor 16 in the active mode, thereby eliminating such a possibility of signal conflict.

In what follows, a description will be given with regard to embodiments in which the voltage pumping-up circuit of the present invention is applied to a semiconductor memory device such as a DRAM.

Figure 4:
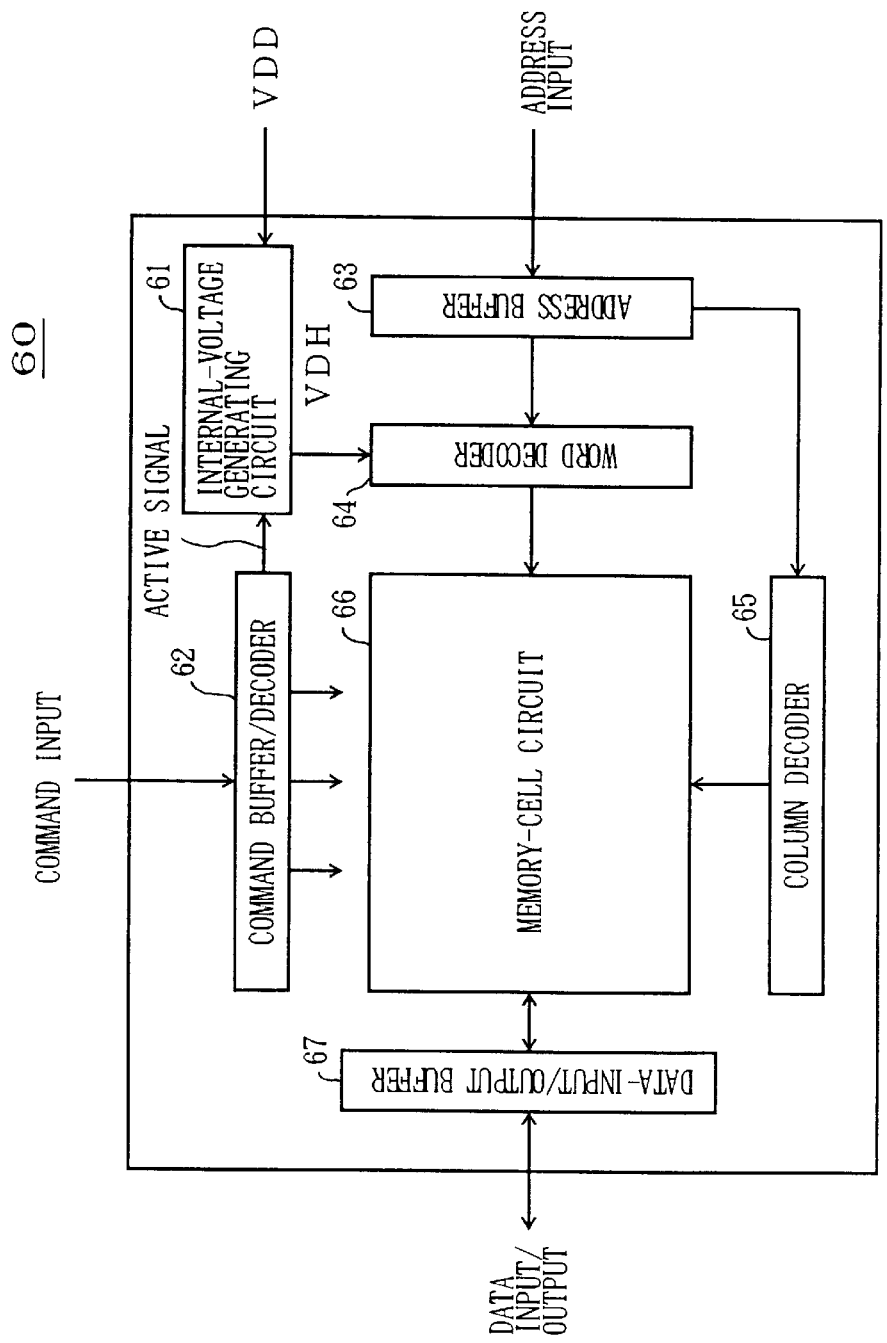
FIG. 4 is a block diagram of a semiconductor memory device to which the voltage pumping-up circuit of the present invention is applied.

FIG. 4 is a block diagram of a semiconductor memory device to which the voltage pumping-up circuit 1 or the voltage pumping-up circuit 1A of the present invention is applied.

A semiconductor memory device 60 of FIG. 4 includes an internal-voltage generating circuit 61, a command buffer/decoder 62, an address buffer 63, a word decoder 64, a column decoder 65, a memory-cell circuit 66, and a data-input/output buffer 67. A configuration of the semiconductor memory device 60 of FIG. 4 shows only those elements which are necessary for description of the present invention.

The internal-voltage generating circuit 61 includes the voltage pumping-up circuit 1 or the voltage pumping-up circuit 1A of the present invention, and generates the pumped-up voltage VDH based on the power voltage VDD received from an external source. Switching of operations of the voltage pumping-up circuit 1 or 1A between different operation modes is controlled by an active signal generated by the command buffer/decoder 62. The active signal becomes HIGH in the active mode and LOW in the standby mode. The pumped-up voltage VDH generated by the internal-voltage generating circuit 61 is supplied to the word decoder 64.

The command buffer/decoder 62 receives and decodes command inputs, and controls each internal circuit of the semiconductor memory device 60 based on commands. In this manner, a data-read operation and a data-write operation with regard to the memory-cell circuit 66 are performed. When results of command decoding indicate the active mode, the command buffer/decoder 62 turns the active signal to HIGH.

Address signals input to the address buffer 63 are supplied to the word decoder 64 and the column decoder 65, and the word decoder 64 and the column decoder 65 access an indicated address in the memory-cell circuit 66. Data is read from the indicated address in the memory-cell circuit 66, and is supplied out of the device via the data-input/output buffer 67. On the other hand, data which is input to the data-input/output buffer 67 is written in an indicated address in the memory-cell circuit 66.

In this example, the word decoder 64 includes word drivers for driving word lines where selected word lines are provided with the pumped-up voltage VDH.

Figure 5:
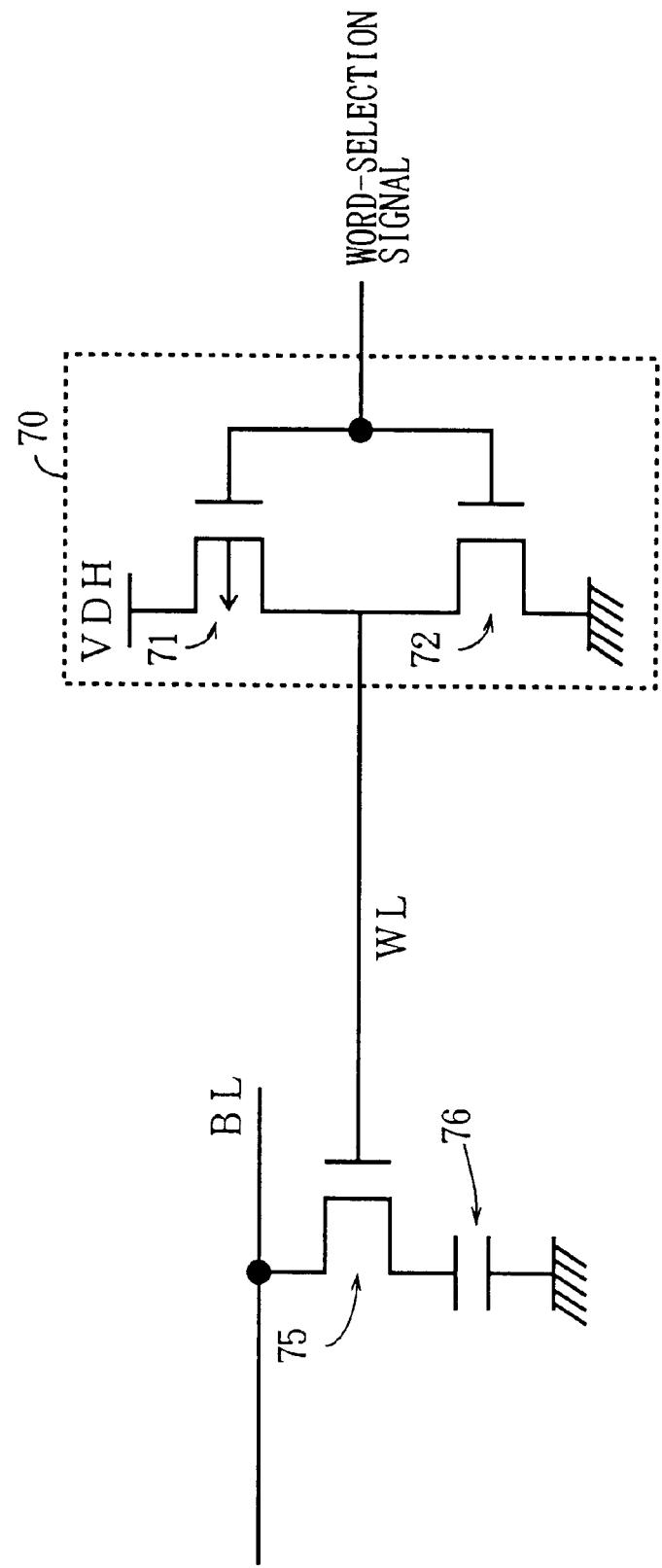
FIG. 5 is a circuit diagram for explaining a mechanism of memory-cell access by word drivers.

FIG. 5 is a circuit diagram for explaining a mechanism of memory-cell access by word drivers. A word driver 70 of FIG. 5, which is part of the word decoder 64 of FIG. 4, turns PMOS transistor 71 on, and turns an NMOS transistor 72 off when a word selection signal is LOW, thereby providing the pumped-up voltage VDH to a word line WL. The word line WL is connected to a gate of a cell transistor 75, which is incorporated into the memory-cell circuit 66 of FIG. 4. When the word line WL is the pumped-up voltage VDH, the cell transistor 75 is turned on, so that data exchange is performed between a bit line BL and a memory cell 76. As previously described, the pumped-up voltage VDH needs to be supplied to the gate of the cell transistor 75 in order to achieve a high-speed data-write operation to write HIGH data (voltage VDD) of the bit line BL into the memory cell 76.

In the semiconductor memory device of FIG. 4, the internal-voltage generating circuit 61 generates the pumped-up voltage VDH by a small current-supply power in the standby mode, and this small current-supply power is only sufficient for operations in the standby mode. In the active mode, the internal-voltage generating circuit 61 generates the pumped-up voltage VDH by a great current-supply power so that a large and surged power consumption of the pumped-up voltage VDH in the memory-cell circuit 66 can be properly handled. As was described in connection with FIG. 2 and FIG. 3, the internal-voltage generating circuit 61 according to the present invention is provided with a mechanism for stepping up the current-supply power in the active mode. Because of this, the internal-voltage generating circuit 61 is designed such that capacitor sizes of the internal-voltage generating circuit 61 are relatively small. In this manner, the present invention can reduce an area size occupied in a chip by the internal-voltage generating circuit 61.

Figure 6:
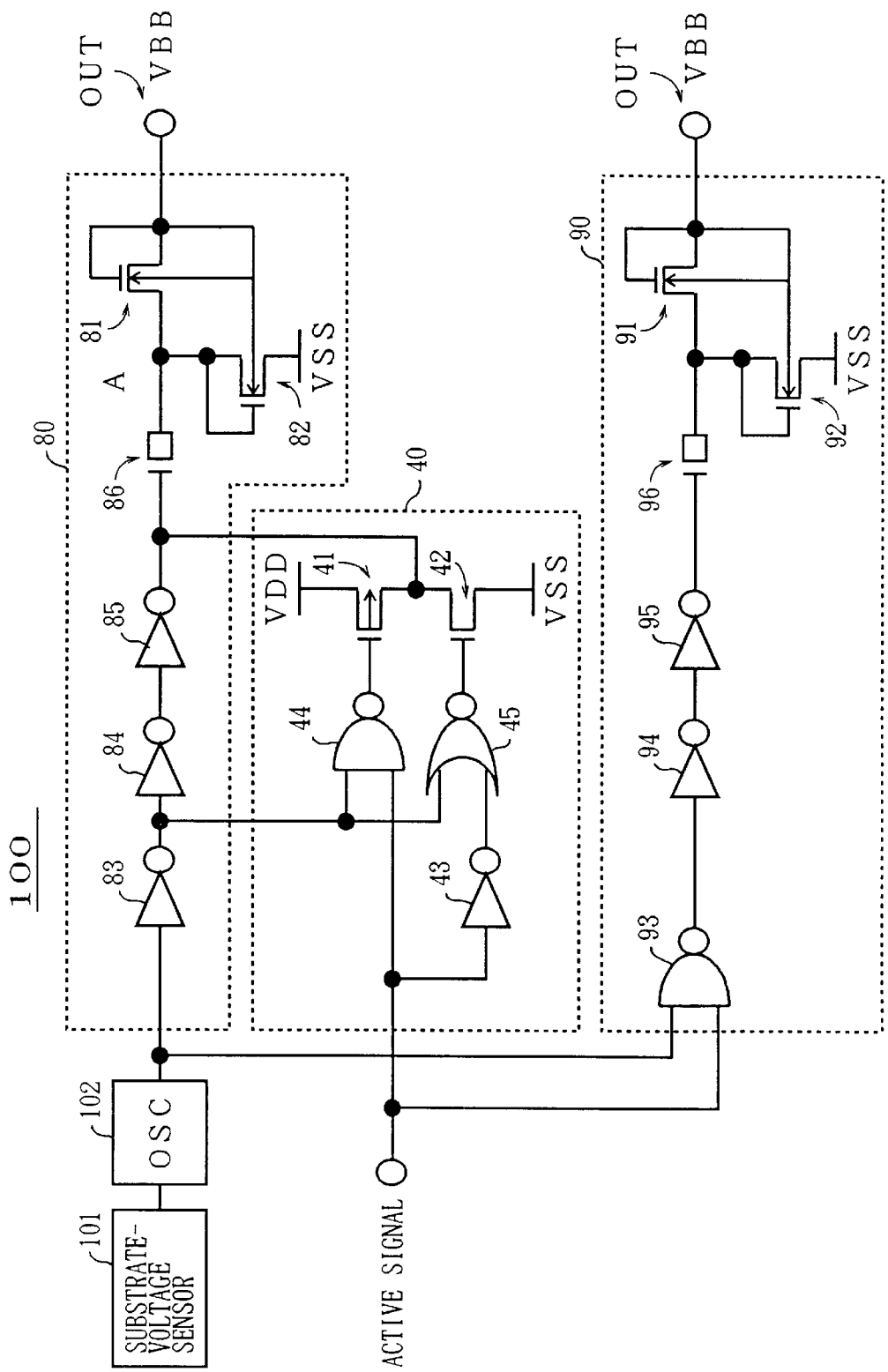
FIG. 6 is a circuit diagram of a substrate-voltage generating circuit according to the present invention.

FIG. 6 is a circuit diagram of a substrate-voltage generating circuit according to the present invention. The substrate-voltage generating circuit generates a substrate voltage level VBB which is lower than the ground voltage, in order to keep a substrate of the semiconductor device at a voltage lower than the ground voltage.

A substrate-voltage generating circuit 100 of FIG. 6 includes a first substrate-voltage generating circuit 80, a second substrate-voltage generating circuit 90, a substrate-voltage sensor 101, an oscillator 102, and the driving-power-control circuit 40. The first substrate-voltage generating circuit 80 includes NMOS transistors 81 and 82, inverters 83 through 85, and a capacitor 86. The second substrate-voltage generating circuit 90 includes NMOS transistors 91 and 92, a NAND circuit 93, inverters 94 and 95, and a capacitor 96.

The driving-power-control circuit 40 is the same element as that of FIG. 2, and elements other than the driving-power-control circuit 40 are the same as those used in conventional substrate-voltage generating circuits.

The first substrate-voltage generating circuit 80 operates at all the time, and is used when the semiconductor device is in either one of a standby mode and an active mode. The second substrate-voltage generating circuit 90 only operates when the semiconductor device is in the active mode. The driving-power-control circuit 40 operates only in the active mode, and steps up current drawing power of the first substrate-voltage generating circuit 80. Switching of the second substrate-voltage generating circuit 90 and the driving-power-control circuit 40 between the two modes is controlled by an active signal which is supplied to the second substrate-voltage generating circuit 90 and the driving-power-control circuit 40. The active signal becomes HIGH when the active mode is used.

Operations of the first substrate-voltage generating circuit 80 and the second substrate-voltage generating circuit 90 will be described below by taking the first substrate-voltage generating circuit 80 as an example.

The first substrate-voltage generating circuit 80 generates a substrate voltage VBB at an output node OUT. When the substrate voltage VBB rises in the semiconductor device to exceed a predetermined voltage level, the substrate-voltage sensor 101 monitoring the substrate voltage VBB activates the oscillator 102. When the oscillator 102 operates, the first substrate-voltage generating circuit 80 lowers the substrate voltage VBB below the predetermined threshold voltage.

In detail, when the oscillator 102 has a LOW-level output, the output of the inverter 85 is HIGH. A current flows through the NMOS transistor 82 serving as a diode, so that a voltage level at a node A becomes VSS+Vth which is higher than the ground voltage VSS by a margin of the threshold voltage level Vth of the NMOS transistor 82. Then, the output of the oscillator 102 is turned into HIGH. In response, the output of the inverter 85 becomes LOW (voltage VSS). Since the output of the inverter 85 is connected to the node A via the capacitor, the voltage at the node A becomes a voltage lower than the voltage VSS. At this time, the substrate voltage VBB is higher than the voltage at the node A, so that the NMOS transistor 81 is turned on. Charge is provided to the capacitor 86 from the output node OUT via the node A, thereby reducing the substrate voltage VBB.

As the oscillator 102 switches its output back and forth between HIGH and LOW, the operation described above is repeated again and again, thereby lowering the substrate voltage VBB below the predetermined voltage level. When the substrate voltage VBB reaches a point lower than the predetermined voltage level, the operation of the oscillator 102 which is controlled by the substrate-voltage sensor 101 stops.

Operations of the second substrate-voltage generating circuit 90 is the same as those of the first substrate-voltage generating circuit 80, except for that the NAND circuit 93 serves as an inverter for inverting the output of the oscillator 102 when the active signal is HIGH, and serves to stop operations of the second substrate-voltage generating circuit 90 when the active signal is LOW.

The inverter 85 for driving the capacitor 86 in the first substrate-voltage generating circuit 80 has a relatively small driving power since this driving power only needs to satisfy a required current drawing power in the standby mode.

The first substrate-voltage generating circuit 80 also operates in the active mode. In the active mode, the current drawing power of the first substrate-voltage generating circuit 80 is stepped up by the driving-power-control circuit 40. Operations of the driving-power-control circuit 40 are the same as those described in connection with FIG. 2, and a description thereof will be omitted.

In the active mode, therefore, the capacitor 86 of the first substrate-voltage generating circuit 90 is driven by the inverter 85 of the first substrate-voltage generating circuit 80 as well as by the NMOS transistor 42 which is an output transistor of the driving-power-control circuit 40. The PMOS transistor 41 and the NMOS transistor 42 have a relatively wide gate width and a relatively small internal resistance, and, thus, have a greater current driving power than the inverter 85.

In this manner, the amount of charge drawn from the output node OUT is commensurate with a sum of the driving power of the inverter 85 and the great driving power of the NMOS transistor 42, so that the first substrate-voltage generating circuit 80 exhibits a great current drawing power in the active mode.

In the standby mode, the output of the driving-power-control circuit 40 is put in a floating state (high-impedance state) as in the case of FIG. 2. The driving-power-control circuit 40 thus does not interfere with the operation of the first substrate-voltage generating circuit 80 in the standby mode.

As described above, the substrate-voltage generating circuit 100 of FIG. 6 in the standby mode allows only the first substrate-voltage generating circuit 80 to operate and supply the substrate voltage VBB by the small current drawing power. In the active mode, the second substrate-voltage generating circuit 90 is operated to supply the substrate voltage VBB by the great current drawing power, and, at the same time, the first substrate-voltage generating circuit 80 having a driving power boosted by the driving-power-control circuit 40 supplies the substrate voltage VBB by the great current drawing power. Accordingly, the size of the capacitor 96 in the second substrate-voltage generating circuit 90 can be made smaller as the current drawing power of the first substrate-voltage generating circuit 80 is stepped up.

Assuming that the driving power of the driving-power-control circuit 40 is about the same as that of the inverter 95 of the second substrate-voltage generating circuit 90, the size of the capacitor 96 of the second substrate-voltage generating circuit 90 can be reduced by the size of the capacitor 86 of the first substrate-voltage generating circuit 80. In this case, an area ratio of the capacitor 86 to the capacitor 96 can be reduced to 1:2 from an area ratio of 1:3, for example, thereby reducing an area size occupied by the capacitors.

Figure 7:
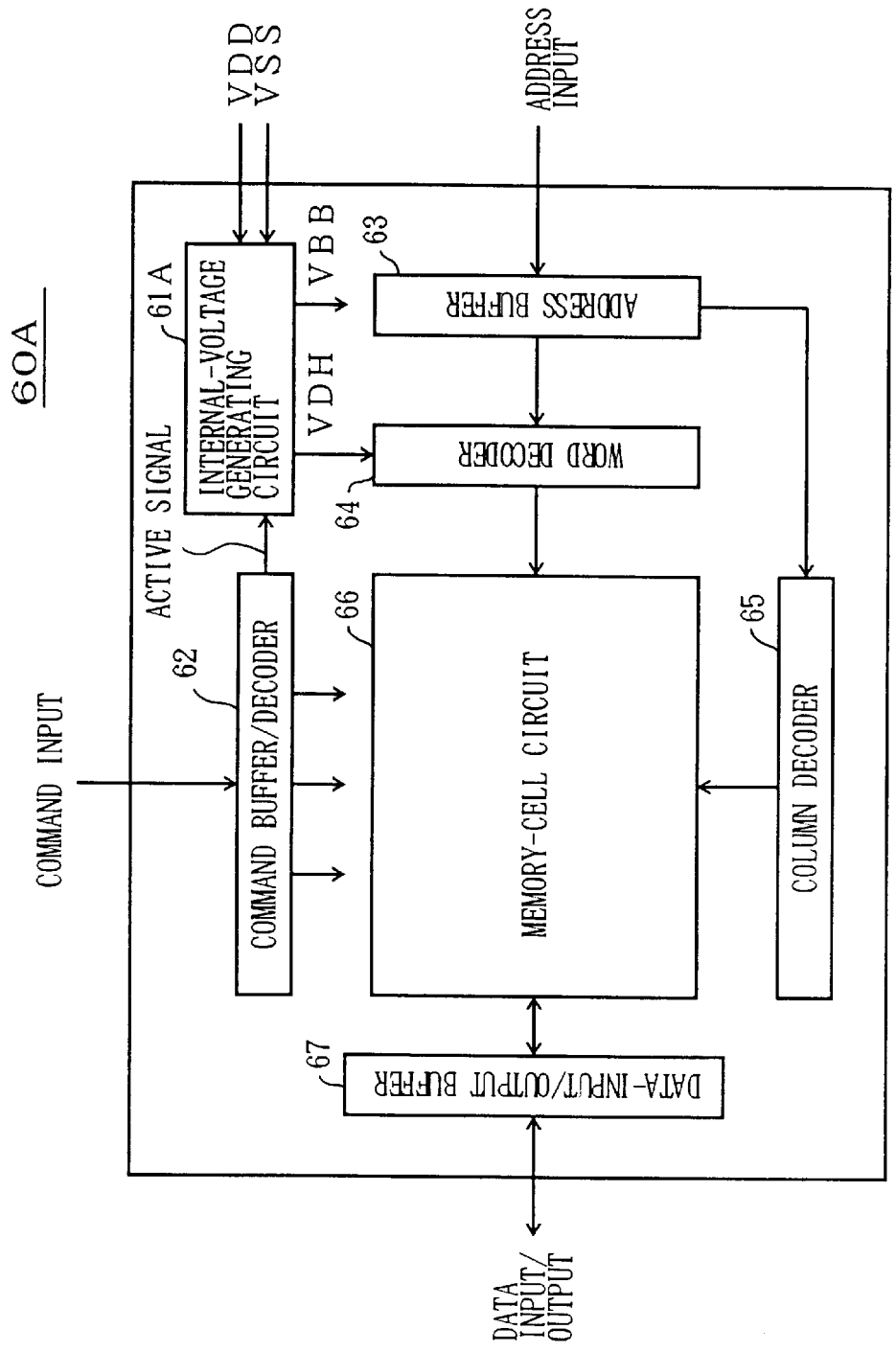
FIG. 7 is a block diagram of a semiconductor memory device to which the substrate-voltage generating circuit of the present invention is applied.

FIG. 7 is a block diagram of a semiconductor memory device to which the substrate-voltage generating circuit 100 of the present invention is applied. In FIG. 7, the same elements as those of FIG. 4 are referred to by the same numerals, and a description thereof will be omitted.

A semiconductor memory device 60A of FIG. 7 includes an internal-voltage generating circuit 61A, the command buffer/decoder 62, the address buffer 63, the word decoder 64, the column decoder 65, the memory-cell circuit 66, and the data-input/output buffer 67.

The internal-voltage generating circuit 61A includes the substrate-voltage generating circuit 100 of the present invention in addition to the internal-voltage generating circuit 61 of FIG. 4, and generates the substrate voltage VBB based on the ground voltage VSS received from an external source.

Switching of operations of the substrate-voltage generating circuit 100 between different operation modes is controlled by the active signal generated by the command buffer/decoder 62. The substrate voltage VBB generated by the internal-voltage generating circuit 61A is supplied to a substrate of the semiconductor memory device 60A.

Figure 8:
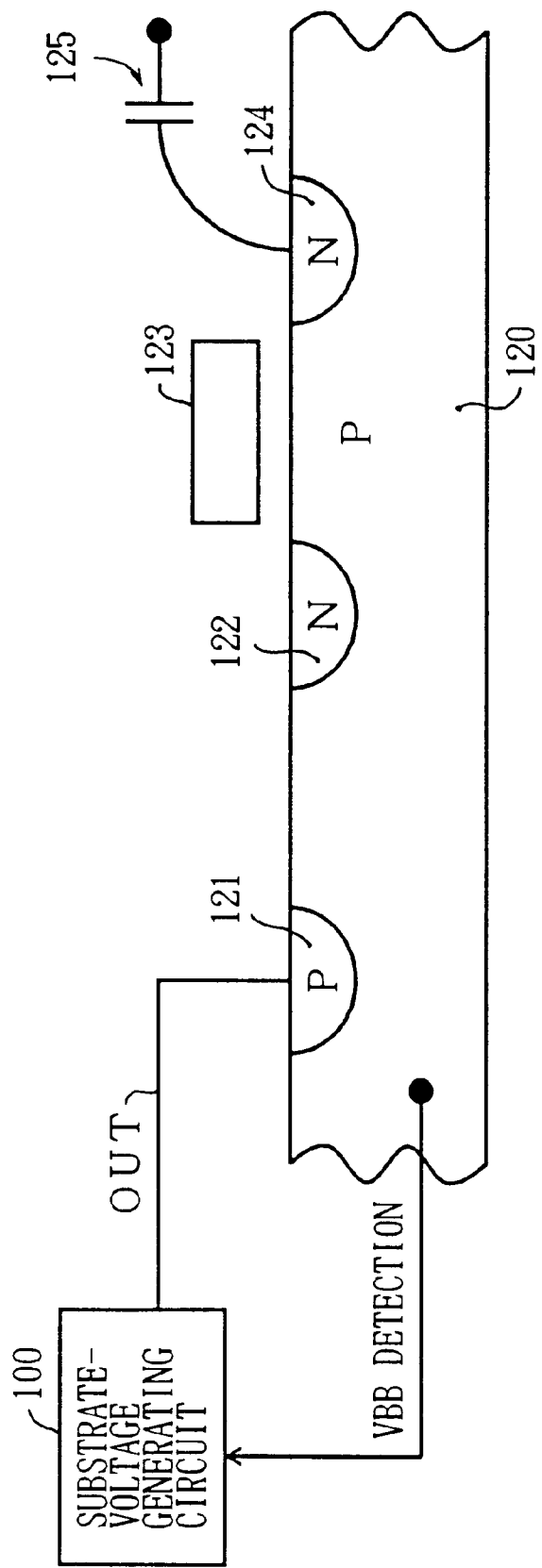
FIG. 8 is an illustrative drawing showing adjustment of a substrate voltage by an internal-voltage generating circuit of FIG. 7.

FIG. 8 is an illustrative drawing showing adjustment of the substrate voltage VBB by the internal-voltage generating circuit 61A in the semiconductor device of FIG. 7.

In FIG. 8, a P-type region 121 and N-type regions 122 and 124 are formed in the P-type substrate 120, and a gate 123 is provided between the N-type regions 122 and 124. A capacitor 125 is connected to the N-type region 124. The capacitor 125 is supposed to be a memory cell of the memory-cell circuit 66, and the N-type regions 122 and 124 with the gate 123 are supposed to be a cell transistor. The output of the substrate-voltage generating circuit 100 of the internal-voltage generating circuit 61A is connected to the P-type region 121, and lowers the substrate voltage VBB of the substrate 120 by drawing charge from the substrate 120. The operation of the substrate-voltage generating circuit 100 is controlled by detecting the substrate voltage VBB. When the substrate voltage VBB becomes higher than a predetermined voltage level, the substrate-voltage generating circuit 100 draws charge from the substrate 120 to lower the substrate voltage VBB of the substrate 120. This makes it possible to keep the substrate voltage VBB of the substrate 120 at a constant voltage level.

In the semiconductor device of FIG. 7, the internal-voltage generating circuit 61A exhibits a small current drawing power for supplying substrate voltage VBB in the standby mode, and this small current drawing power is only sufficient for the standby mode. In the active mode, a great current drawing power is used for supplying the substrate voltage VBB so as to be able to respond to an abrupt and large change in the substrate voltage VBB.

As was described in connection with FIG. 6, the internal-voltage generating circuit 61A (the substrate-voltage generating circuit 100) of the present invention is provided with a function to step up current drawing power in the active mode. The internal-voltage generating circuit 61A can thus be designed such that an area size of capacitors in the internal-voltage generating circuit 61A is relatively small. Accordingly, the present invention can reduce an area size in a chip occupied by the internal-voltage generating circuit 61A.

Further, the present invention is not limited to these embodiments, but various variations and modifications may be made without departing from the scope of the present invention.

What is claimed is:

1. A semiconductor device operable in a first mode and a second mode, said semiconductor device comprising:
   a first voltage generating circuit operating in said first mode and said second mode and having a power to supply a first amount of current in said first mode to a voltage node; and
   a second voltage generating circuit operating only in said second mode and having a power to supply a second amount of current greater than said first amount of current to the voltage node,
   wherein said first voltage generating circuit outputs a current in said second mode greater than said first amount of current.

2. The semiconductor device as claimed in claim 1, wherein said first voltage generating circuit comprises:
   a first capacitor for supplying the first amount of current to the voltage node;
   a first driver circuit driving said first capacitor at least in said first mode; and
   a second driver circuit driving said first capacitor only in said second mode.

3. The semiconductor device as claimed in claim 2, wherein said second driver circuit has a current driving power greater than that of said first driver circuit.

4. The semiconductor device as claimed in claim 2, wherein an output of said second driver circuit is in a high-impedance state in said first mode.

5. The semiconductor device as claimed in claim 2, wherein an output of said first driver circuit is in a high-impedance state in said second mode.

6. The semiconductor device as claimed in claim 2, wherein said second voltage generating circuit comprises:
   a second capacitor for supplying the second amount of current to the voltage node; and
   a third driver circuit driving said second capacitor in said second mode,
   wherein said second capacitor has substantially such a capacitance that the increased first amount of current in the second mode together with the second amount of current are barely sufficient to keep the voltage node at such a voltage level as required by the semiconductor device in the second mode.

7. The semiconductor device as claimed in claim 1, wherein said first voltage generating circuit and said second voltage generating circuit comprise a voltage pumping-up circuit for generating a voltage higher than a supplied voltage.

8. The semiconductor device as claimed in claim 1, wherein said first voltage generating circuit and said second voltage generating circuit comprise a circuit for generating a voltage lower than a supplied voltage.

9. A semiconductor device operable in one of at least two different modes including a standby mode and an active mode, said semiconductor device comprising:
   a first voltage pumping-up circuit operating in said standby mode and said active mode and having a first current-supply power; and
   a second voltage pumping-up circuit operating only in said active mode and having a second current-supply power greater than said first current-supply power,
   wherein said first voltage pumping-up circuit comprises:
   a first pump-up capacitor for generating a voltage higher than a supplied power voltage;
   a first driver circuit driving said first pump-up capacitor at least in said standby mode; and
   a second driver circuit driving said first pump-up capacitor only in said active mode,
   wherein said first current-supply power is greater in said active mode than in said standby mode.

10. The semiconductor device as claimed in claim 9, wherein said second voltage pumping-up circuit comprises:
   a second pump-up capacitor for generating said voltage higher than said supplied power voltage; and
   a third driver circuit driving said second pump-up capacitor in said active mode,
   wherein said second pump-up capacitor has substantially such a capacitance that the first current-supply power in the second mode together with the second current-supply power are barely sufficient to generate such a voltage as required by the semiconductor device in the second mode.

11. A semiconductor device operable in one of at least two different modes including a standby mode and an active mode, said semiconductor device comprising:
- a first substrate-voltage generating circuit operating in said standby mode and said active mode and having a first current drawing power; and
- a second substrate-voltage generating circuit operating only in said active mode and having a second current drawing power greater than said first current drawing power,
- wherein said first substrate-voltage generating circuit comprises:
  - a first capacitor for generating a voltage lower than a supplied ground voltage;
  - first driver circuit driving said first capacitor at least in said standby mode; and
  - a second driver circuit driving said first capacitor only in said active mode,
- wherein said first current drawing power is greater in said active mode than in said standby mode.

12. The semiconductor device as claimed in claim 11, wherein said second substrate-voltage generating circuit comprises:
- a second capacitor for generating said voltage lower than said supplied ground voltage; and
- a third driver circuit driving said second capacitor in said active mode,
- wherein said second capacitor has substantially such a capacitance that the first current drawing power in the second mode together with the second current drawing power are barely sufficient to generate such a voltage as required by the semiconductor device in the second mode.

13. A semiconductor integrated circuit comprising:
- a first pump circuit, including a first capacitor having a first node and a second node, said first node alternately coupled to a power supply voltage node or an output node;
- a first driving circuit for driving said second node of the first capacitor in response to an oscillation signal; and
- a second driving circuit for driving said second node of the first capacitor in response to said oscillation signal and an activation signal.

14. The semiconductor integrated circuit according to claim 13, further comprising:
- a second pump circuit, including a second capacitor having a third node and a fourth node, said third node alternatively coupled to said power supply voltage node or said output node; and
- a third driving circuit for driving said fourth node of the second capacitor in response to said oscillation signal and said activation signal.

* * * * *